United States Patent
Moon et al.

(10) Patent No.: US 12,028,637 B2
(45) Date of Patent: *Jul. 2, 2024

(54) IMAGE SENSING SYSTEM FOR CONVERTING AN IMAGE SIGNAL TO HAVE A SPECIFIC PATTERN

(71) Applicant: SAMSUNG ELECTRONICS CO., LTD., Suwon-si (KR)

(72) Inventors: Jang Ho Moon, Hwaseong-si (KR); Deok Ha Shin, Anyang-si (KR); Je Suk Lee, Suwon-si (KR); Hee Geun Park, Suwon-si (KR); So Young Jeong, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/341,000

(22) Filed: Jun. 26, 2023

(65) Prior Publication Data

US 2023/0336890 A1 Oct. 19, 2023

Related U.S. Application Data

(63) Continuation of application No. 17/475,777, filed on Sep. 15, 2021, now Pat. No. 11,729,532.

(30) Foreign Application Priority Data

Sep. 15, 2020 (KR) .................. 10-2020-0118081

(51) Int. Cl.
*H04N 25/77* (2023.01)
*H01L 27/146* (2006.01)

(52) U.S. Cl.
CPC ....... *H04N 25/77* (2023.01); *H01L 27/14621* (2013.01); *H01L 27/14627* (2013.01)

(58) Field of Classification Search
CPC .... H04N 25/77; H04N 23/843; H04N 25/133; H04N 25/68; H04N 25/76; H04N 25/75;
(Continued)

(56) References Cited

U.S. PATENT DOCUMENTS 8,582,007 B2 11/2013 Kim et al.
9,288,457 B2 3/2016 Saito
(Continued)

FOREIGN PATENT DOCUMENTS

JP 6643250 B2 2/2020
KR 10-0725192 B1 6/2007
(Continued)

*Primary Examiner* — Gevell V Selby
(74) *Attorney, Agent, or Firm* — Sughrue Mion, PLLC

(57) ABSTRACT

An image sensing system includes a camera module and an application processor. The camera module includes: an image sensor including a pixel array, the pixel array including color filters having a first pattern, the image sensor being configured to sense light incident on the pixel array to generate a first pattern image signal having the first pattern; a first converter configured to convert the first pattern image signal into a second pattern image signal having a second pattern different from the first pattern; and a second converter configured to convert the second pattern image signal into a third pattern image signal having a third pattern different from the first pattern and the second pattern. The application processor is configured to perform image processing on the third pattern image signal.

19 Claims, 24 Drawing Sheets

(58) Field of Classification Search
CPC .. H04N 23/12; H04N 25/11; H01L 27/14621; H01L 27/14627; H01L 27/14609; H01L 27/14625; H01L 27/14605; H01L 27/14603
See application file for complete search history.

(56) References Cited

U.S. PATENT DOCUMENTS

| | | |
|---|---|---|
| 9,324,132 B2 | 4/2016 | Kim et al. |
| 9,640,102 B2 | 5/2017 | Jin et al. |
| 10,062,148 B2 | 8/2018 | Chong et al. |
| 11,729,532 B2 * | 8/2023 | Moon ................. H04N 25/133 348/222.1 |
| 2010/0231770 A1 | 9/2010 | Honda et al. |
| 2017/0366723 A1 | 12/2017 | Kurata et al. |
| 2018/0122285 A1 | 5/2018 | Ogaki et al. |
| 2018/0167544 A1 | 6/2018 | Jeong et al. |
| 2019/0182446 A1 | 6/2019 | Tsunai et al. |
| 2020/0410636 A1 | 12/2020 | Kim |
| 2021/0280618 A1 | 9/2021 | Yamashita et al. |

FOREIGN PATENT DOCUMENTS

| | | |
|---|---|---|
| KR | 10-1332689 B1 | 11/2013 |
| KR | 10-1703354 B1 | 2/2017 |

* cited by examiner

| W1 | B1 | W2 | G1 | W3 | B2 | W4 | G2 |
|----|----|----|----|----|----|----|----|
| B3 | W5 | G3 | W6 | B4 | W7 | G4 | W8 |
| W9 | G5 | W10 | R1 | W11 | G6 | W12 | R2 |
| G7 | W13 | R3 | W14 | G8 | W15 | R4 | W16 |
| W17 | B5 | W18 | G9 | W19 | B6 | W20 | G10 |
| B7 | W21 | G11 | W22 | B8 | W23 | G12 | W24 |
| W25 | G13 | W26 | R5 | W27 | G14 | W28 | R6 |
| G15 | W29 | R7 | W30 | G16 | W31 | R8 | W32 |

| G1 | G2 | G3 | R1 | R2 | R3 |
|----|----|----|----|----|----|
| G4 | G5 | G6 | R4 | R5 | R6 |
| G7 | G8 | G9 | R7 | R8 | R9 |
| B1 | B2 | B3 | G10 | G11 | G12 |
| B4 | B5 | B6 | G13 | G14 | G15 |
| B7 | B8 | B9 | G16 | G17 | G18 |

IMAGE SENSING SYSTEM FOR CONVERTING AN IMAGE SIGNAL TO HAVE A SPECIFIC PATTERN

CROSS-REFERENCE TO RELATED APPLICATION

This application is a continuation of U.S. application Ser. No. 17/475,777, filed Sep. 15, 2021, which claims priority from Korean Patent Application No. 10-2020-0118081 filed on Sep. 15, 2020 in the Korean Intellectual Property Office, the disclosures of which are incorporated by reference herein in their entireties.

BACKGROUND

1. Field

The present disclosure relates to an image sensing system.

2. Description of Related Art

An image sensing device is one of semiconductor devices that convert optical information into electrical signals. Examples of the image sensing device may include a charge coupled device (CCD) image sensing device and a complementary metal oxide semiconductor (CMOS) image sensing device.

A CMOS type image sensor may be abbreviated as CIS. The CIS may include a plurality of pixels arranged two-dimensionally. Each of the pixels may include, for example, a photodiode (PD). The photodiode may serve to convert incident light into an electrical signal.

In recent years, with the development of the computer industry and the telecommunications industry, demands for image sensors with improved performance have been increased in various fields, such as digital cameras, camcorders, smartphones, game devices, security cameras, medical micro cameras, robots, and the like.

SUMMARY

One or more example embodiments provide an image sensing system that does not require redesign of an image signal processor even when a color filter is changed.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

Specific details of other embodiments are included in the detailed description and drawings.

According to an aspect of an example embodiment, there is provided an image sensing system including: a camera module; and an application processor electrically connected to the camera module, wherein the camera module includes: an image sensor including a pixel array, the pixel array including color filters having a first pattern, the image sensor being configured to sense light incident on the pixel array to generate a first pattern image signal having the first pattern; a first converter configured to convert the first pattern image signal into a second pattern image signal having a second pattern, the second pattern being different from the first pattern; and a second converter configured to convert the second pattern image signal into a third pattern image signal having a third pattern, the third pattern being different from the first pattern and the second pattern, and wherein the application processor is configured to perform image processing on the third pattern image signal.

According to an aspect of an example embodiment, there is provided an image sensing system including: an image sensor including a pixel array, the pixel array including color filters having a first pattern, the image sensor being configured to sense light incident on the pixel array to generate a first pattern image signal having the first pattern; an image signal processor configured to convert the first pattern image signal into a second pattern image signal having a second pattern, the second pattern being different from the first pattern; and an application processor configured to perform first image processing on the second pattern image signal, wherein the first pattern image signal includes a first pixel value, a second pixel value, and a third pixel value, the first pixel value corresponding to a first color, and the second pixel value and the third pixel value corresponding to a second color, wherein the image signal processor is further configured to convert the third pixel value into a fourth pixel value based on the first pixel value and the second pixel value, the fourth pixel value corresponding to the first color, and wherein the second pattern image signal includes the first pixel value and the fourth pixel value.

According to an aspect of an example embodiment, there is provided an image sensing system including: a first image sensor including a first pixel array, the first pixel array including a first color filter having a first pattern, the first image sensor being configured to sense light incident on the first pixel array to generate a first image signal having the first pattern; a second image sensor including a second pixel array, the second pixel array including a second color filter having a second pattern, the second image sensor being configured to sense light incident on the second pixel array to generate a second image signal having the second pattern, the second pattern being different from the first pattern; a first image signal processor configured to generate a third image signal having the second pattern based on the first image signal; and a second image signal processor configured to perform image processing on the third image signal, and perform the image processing on the second image signal which has not passed through the first image signal processor.

BRIEF DESCRIPTION OF THE DRAWINGS

The above and/or other aspects will be more apparent by describing certain example embodiments with reference to the accompanying drawings, in which:

FIG. 5 is a diagram for describing an image signal according to some example embodiments;

FIG. 14 is a diagram for describing an image signal according to some example embodiments;

DETAILED DESCRIPTION

Hereinafter, example embodiments will be described with reference to the accompanying drawings.

Hereinafter, an image sensing system 1 including an image sensor 100 including a pixel array PA, a first image signal processor 200, and an application processor 300 according to example embodiments will be described with reference to FIGS. 1 to 18.

Figure 1:
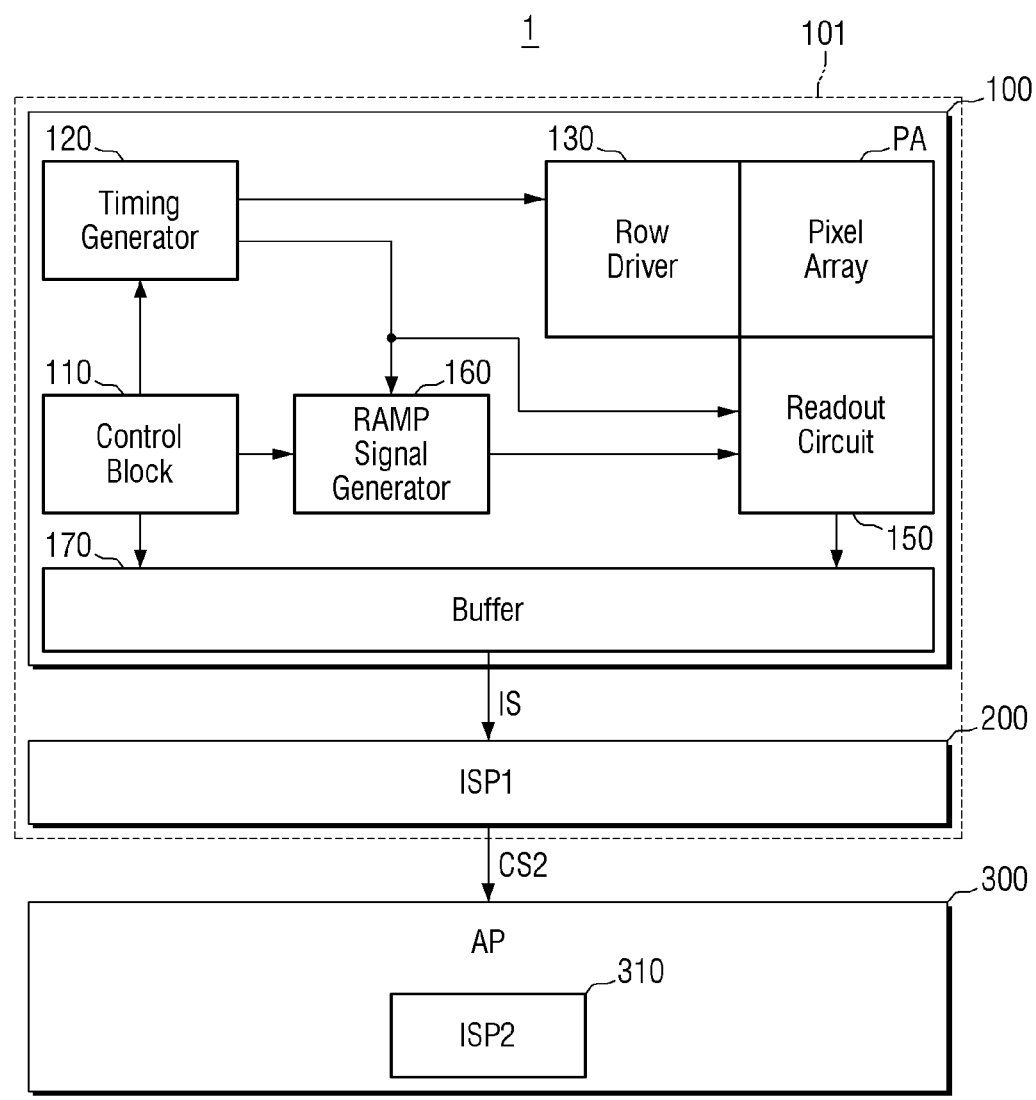
FIG. 1 is a block diagram of an image sensing system according to some example embodiments.

FIG. 1 is a block diagram of an image sensing system according to some example embodiments.

Referring to FIG. 1, the image sensing system 1 may include a camera module 101 and the application processor 300. Here, the camera module 101 may include the image sensor 100 and the first image signal processor 200. The camera module 101 may be a camera assembly.

The image sensor 100 may generate an image signal IS by sensing an image of a sensing target using incident light. In some embodiments, the generated image signal IS may be, for example, a digital signal, but embodiments are not limited thereto.

The image signal IS may be provided to the first image signal processor 200 to be processed. For example, the first image signal processor 200 may generate a second converted signal CS2 obtained by converting the image signal IS.

The application processor 300 may receive the second converted signal CS2 from the camera module 101. For example, the application processor 300 may receive the second converted signal CS2 from the first image signal processor 200. The application processor 300 may process the second converted signal CS2 to facilitate display of an image based on the second converted signal CS2. For example, a second image signal processor 310 included in the application processor 300 may perform image processing on the second converted signal CS2.

In some embodiments, the camera module 101 and the application processor 300 may be disposed separately as illustrated in FIG. 1. For example, the camera module 101 may be mounted on a first chip and the application processor 300 may be mounted on a second chip, thereby communicating with each other through an interface. However, embodiments according to the disclosure are not limited thereto, and the image sensor 100 and the first image signal processor 200 included in the camera module 101, and the application processor 300 may be implemented as one package, for example, a multi chip package (MCP).

The image sensor 100 may include a control register block 110, a timing generator 120, a row driver 130, the pixel array PA, a readout circuit 150, a ramp signal generator 160, and a buffer 170.

The control register block 110 may control the overall operation of the image sensor 100. In particular, the control register block 110 may directly transmit operation signals to the timing generator 120, the ramp signal generator 160 and the buffer 170.

The timing generator 120 may generate a reference signal for operation timing of various components of the image sensor 100. The reference signal for operation timing generated by the timing generator 120 may be transmitted to the row driver 130, the readout circuit 150, the ramp signal generator 160, and the like.

The ramp signal generator 160 may generate and transmit a ramp signal used in the readout circuit 150. For example, the readout circuit 150 may include a correlated double sampler (CDS), a comparator, and the like, and the ramp signal generator 160 may generate and transmit the ramp signal used in the correlated double sampler (CDS), the comparator, and the like.

The buffer 170 may include, for example, a latch. The buffer 170 may temporarily store the image signal IS to be provided to the outside, and transmit the image signal IS to an external memory or an external device.

The pixel array PA may sense an external image. The pixel array PA may include a plurality of pixels (or unit pixels). The row driver 130 may selectively activate a row of the pixel array PA.

The readout circuit 150 may sample a pixel signal provided from the pixel array PA, compare the sampled pixel signal with the ramp signal, and convert an analog image signal (data) into a digital image signal (data) based on the comparison result.

Figure 2:
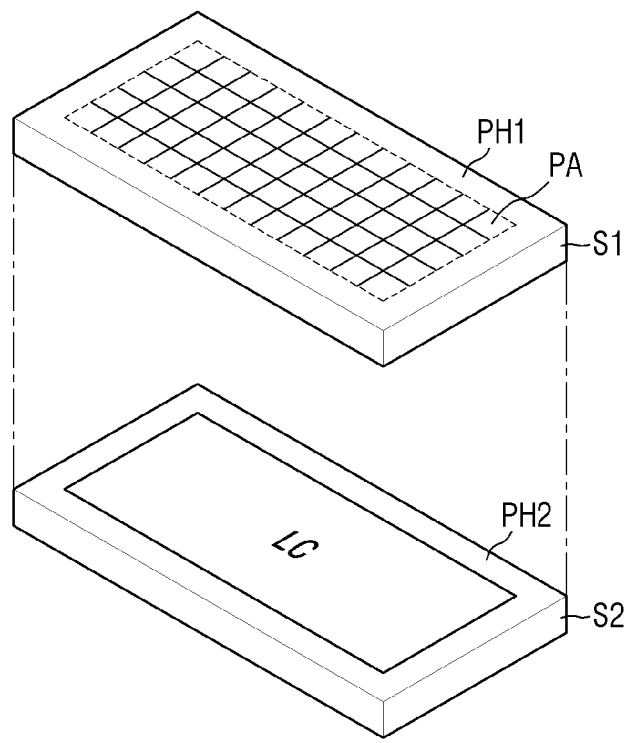
FIG. 2 is a diagram for explaining a conceptual layout of the image sensor of FIG. 1.

FIG. 2 is a diagram for explaining a conceptual layout of the image sensor of FIG. 1.

Referring to FIG. 2, the image sensor 100 may include a first region S1 and a second region S2 stacked in a first direction (e.g., vertical direction). The first region S1 and the second region S2 may extend in a second direction crossing the first direction and a third direction crossing the first direction as illustrated in FIG. 2, and blocks illustrated in FIG. 1 may be disposed in the first region S1 and the second region S2.

Although not shown in the drawing, a third region in which a memory is disposed may be disposed under the second region S2. In this case, the memory disposed in the third region may receive image data from the first and second regions S1 and S2, store or process the image data, and retransmit the image data to the first and second regions S1 and S2. In this case, the memory may include a memory element, such as a dynamic random access memory (DRAM), a static random access memory (SRAM), a spin transfer torque magnetic random access memory (STT-MRAM), and a flash memory. When the memory includes, for example, a DRAM, the memory may receive and process the image data at a relatively high speed. Further, in some embodiments, the memory may be disposed in the second region S2.

The first region S1 may include the pixel array PA and a first peripheral area PH1, and the second region S2 may include a logic circuit area LC and a second peripheral area PH2. The first and second regions S1 and S2 may be sequentially stacked vertically.

In the first region S1, the pixel array PA may be the same as the pixel array PA described with reference to FIG. 1. The pixel array PA may include a plurality of unit pixels arranged in a matrix. Each pixel may include a photodiode and transistors. This will be described in more detail later.

The first peripheral area PH1 may include a plurality of pads and may be disposed around the pixel array PA. The pads may transmit and/or receive electrical signals to and/or from the external device.

In the second region S2, the logic circuit area LC may include electronic elements having a plurality of transistors. The electronic elements included in the logic circuit area LC may be electrically connected to the pixel array PA to provide a signal to each unit pixel of the pixel array PA or control an output signal of each unit pixel.

In the logic circuit area LC, for example, the control register block 110, the timing generator 120, the row driver 130, the readout circuit 150, the ramp signal generator 160 and the buffer 170 described with reference to FIG. 1 may be disposed. For example, among the blocks of FIG. 1, the blocks other than the pixel array PA may be disposed in the logic circuit area LC.

Also, in the second region S2, the second peripheral area PH2 may be disposed in an area corresponding to the first peripheral area PH1 of the first region S1, but the embodiments are not limited thereto.

Figure 3:
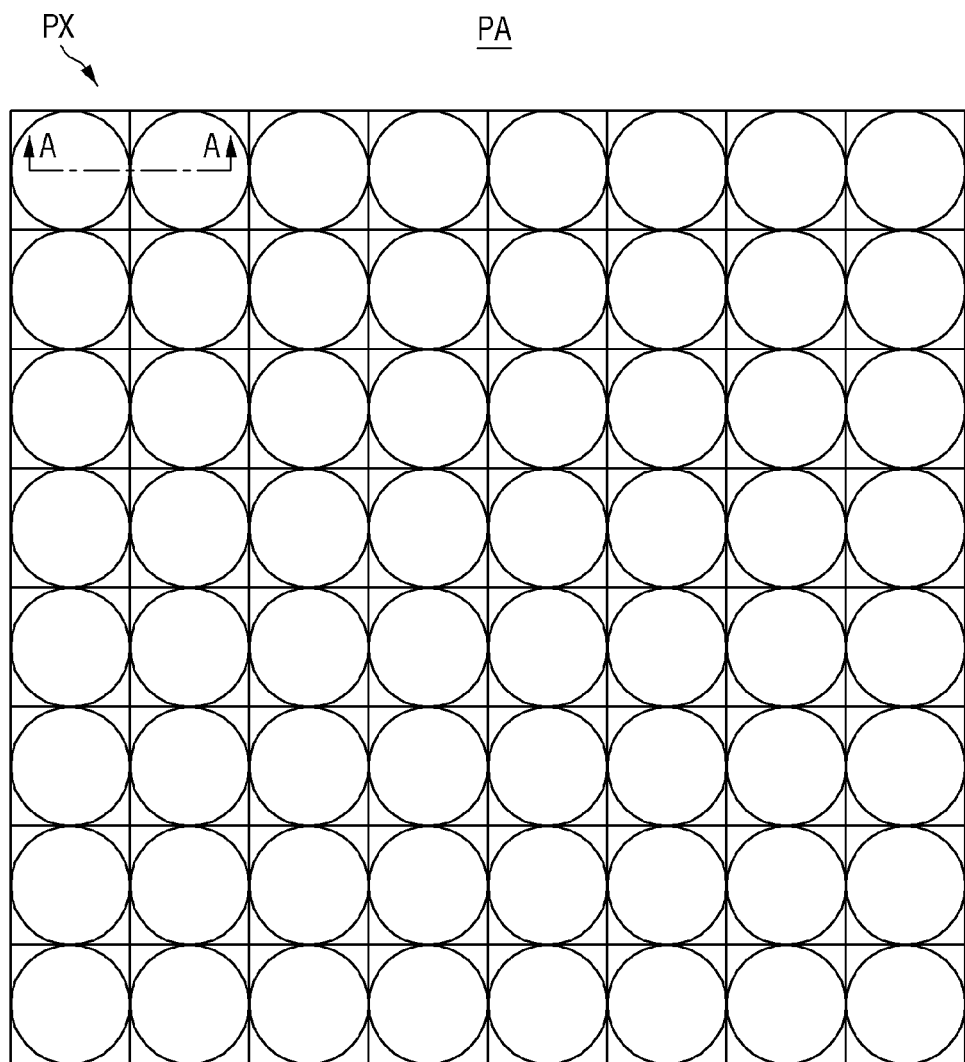
FIG. 3 is a diagram for describing a pixel array according to some example embodiments.
Figure 4:
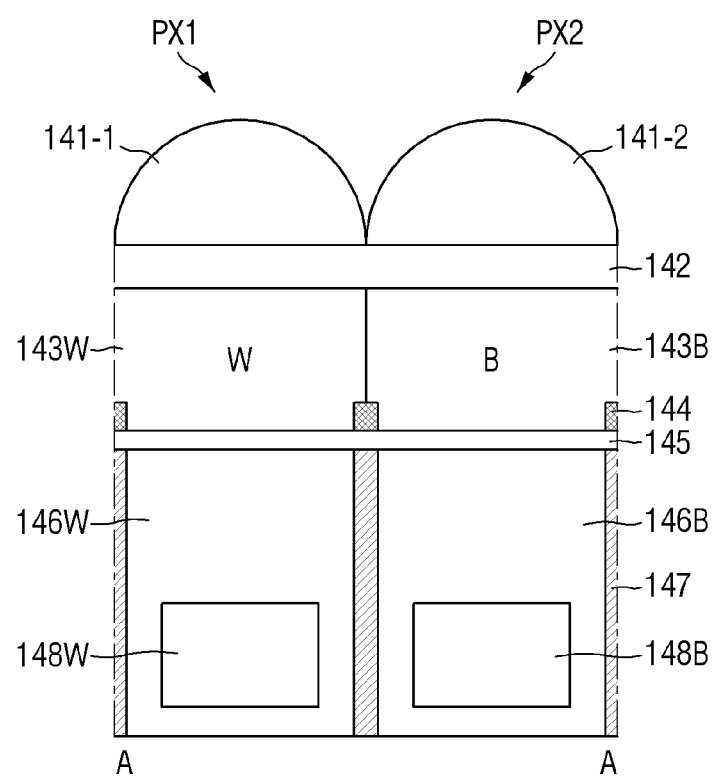
FIG. 4 is a cross-sectional view of the pixel array taken along line A-A of FIG. 3.

FIG. 3 is a diagram for describing a pixel array according to some example embodiments. FIG. 4 is a cross-sectional view of the pixel array taken along line A-A of FIG. 3.

Referring to FIG. 3, the pixel array PA may include a plurality of unit pixels PX. The plurality of unit pixels PX may be two-dimensionally arranged. For example, the plurality of unit pixels PX may be repeatedly disposed in the second direction and the third direction. The unit pixels PX may be arranged at regular intervals. For example, the pixel array PA may be arranged in a Bayer pattern. However, embodiments according to the disclosure are not limited thereto, and the pixel array PA may be arranged in, for example, a tetra pattern or a nona pattern.

Referring to FIG. 4, the pixel array PA may include a unit pixel PX1 and a unit pixel PX2. The unit pixel PX1 and the unit pixel PX2 may be arranged adjacent to each other.

The pixel array PA may include substrates 146W and 146B, photoelectric transistors 148W and 148B, an antireflection film 147, a side antireflection film 144, color filters 143W and 143B, an upper planarization layer 142, and a lower planarization layer 145 and microlenses 141-1 and 141-2.

The substrates 146W and 146B may employ, for example, a P-type or N-type bulk substrate, or may employ a P-type bulk substrate on which a P-type or N-type epitaxial layer is grown, or an N-type bulk substrate on which a P-type or N-type epitaxial layer is grown. In addition to the semiconductor substrates, the substrates 146W and 146B may also employ a substrate such as an organic plastic substrate.

The photoelectric transistors 148W and 148B may be photodiodes, phototransistors, photogates, pinned photodiodes, or any combination thereof.

The antireflection film 147 and the side antireflection film 144 may prevent light incident from the outside onto the microlenses 141-1 and 141-2 from penetrating into W and B regions. The antireflection film 147 and the side antireflection film 144 may be formed of an insulating film such as a silicon oxide film, a silicon nitride film, a silicon oxynitride film, a resin, any combination thereof, or a stack thereof, but the embodiments are not limited thereto.

The upper planarization layer 142 and the lower planarization layer 145 may be formed to be flat with the color filters 143W and 143B interposed therebetween. The upper planarization layer 142 and the lower planarization layer 145 may include at least one of a silicon oxide-based material, a silicon nitride-based material, a resin, or any combination thereof, but the embodiments are not limited thereto.

FIG. 5 is a diagram for describing an image signal according to some example embodiments.

Referring to FIG. 5, the image signal IS may be a signal outputted by the image sensor 100 that senses light from the pixel array PA. For example, light may pass through the color filters 143W and 143B of the pixel array PA to reach the photoelectric transistors 148W and 148B, and the image signal IS may be outputted from the logic circuit area LC.

For example, the image signal IS may include a first white pixel value W1 outputted by sensing light transmitted through the color filter 143W having a white color. Further, the image signal IS may include a first blue pixel value B1 outputted by sensing light transmitted through the color filter 143B having a blue color. That is, white pixel values W1 to W32, green pixel values G1 to G16, blue pixel values B1 to B8, and red pixel values R1 to R8 illustrated in FIG. 5 may be the image signal IS outputted by the image sensor 100 that senses light transmitted through a color filter having a color corresponding to each of white, green, blue, and red colors.

The pixel array PA may be arranged in an RGBW Bayer pattern. That is, the color filters of the pixel array PA may be a combination of a red color filter, a green color filter, a blue color filter, and a white color filter, and the color filters may be arranged in a Bayer type. However, embodiments according to the disclosure are not limited thereto, and the pixel array PA may be, for example, an RGB Bayer pattern, an RGB nano pattern, and the like.

In the image signal IS, pixel values may be arranged in the manner as illustrated in FIG. 5 to correspond to the color of the color filter of the pixel array PA. However, FIG. 5 merely illustrates that each pixel value is arranged according to the position of each unit pixel PX, and the storage position of the pixel value of the actually outputted image signal IS not limited to the illustrated position.

Figure 6:
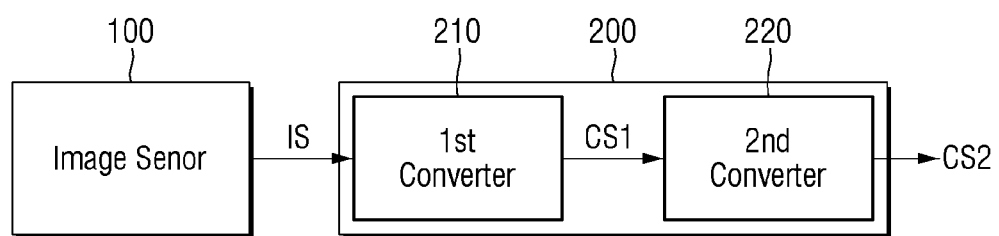
FIG. 6 is a block diagram illustrating an image sensing system according to some example embodiments.
Figure 7:
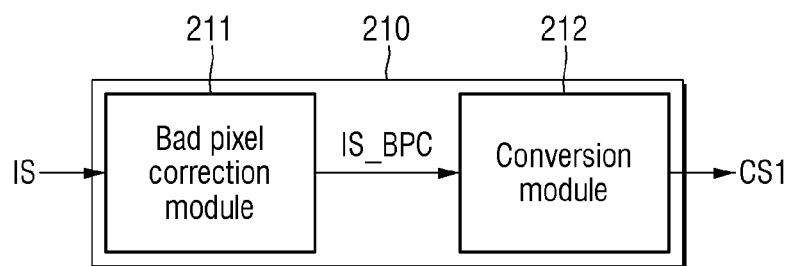
FIG. 7 is a block diagram illustrating a first converter of FIG. 6.

FIG. 6 is a block diagram illustrating an image sensing system according to some example embodiments. FIG. 7 is a block diagram illustrating a first converter of FIG. 6.

Referring to FIG. 6, the first image signal processor 200 may include a first converter 210 and a second converter 220. In FIG. 6, the first converter 210 and the second converter 220 are illustrated to be included in the first image signal processor 200, but embodiments of the disclosure are not limited thereto. For example, only the first converter 210 may be included in the first image signal processor 200, and the second converter 220 may be included in the application processor 300.

The first converter 210 may convert the image signal IS into a first converted signal CS1. The second converter 220 may convert the first converted signal CS1 into a second converted signal CS2. Here, the image signal IS, the first converted signal CS1, and the second converted signal CS2 may be different from each other.

Referring to FIG. 7, the first converter 210 may include a bad pixel correction module 211 and a conversion module 212. The bad pixel correction module 211 may generate a bad pixel correction image signal IS_BPC by receiving the image signal IS and performing correction. The conversion module 212 may generate the first converted signal CS1 by converting the bad pixel correction image signal IS_BPC. Although both the bad pixel correction module 211 and the conversion module 212 are illustrated to be included in the first converter 210, embodiments according to the disclosure are not limited thereto. For example, the first converter 210 may include only the conversion module 212. That is, the bad pixel correction module 211 may be omitted.

Figure 8:
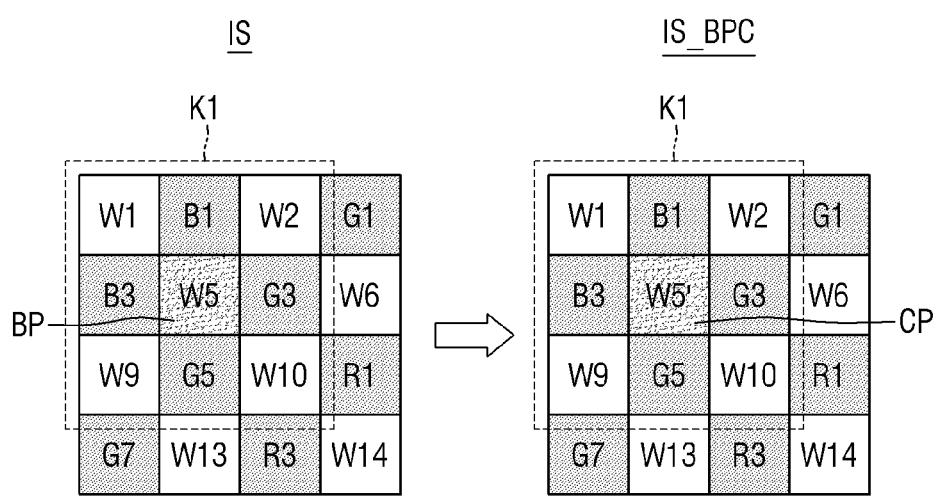
FIG. 8 is a block diagram for describing bad pixel correction in an image signal.
Figure 9:
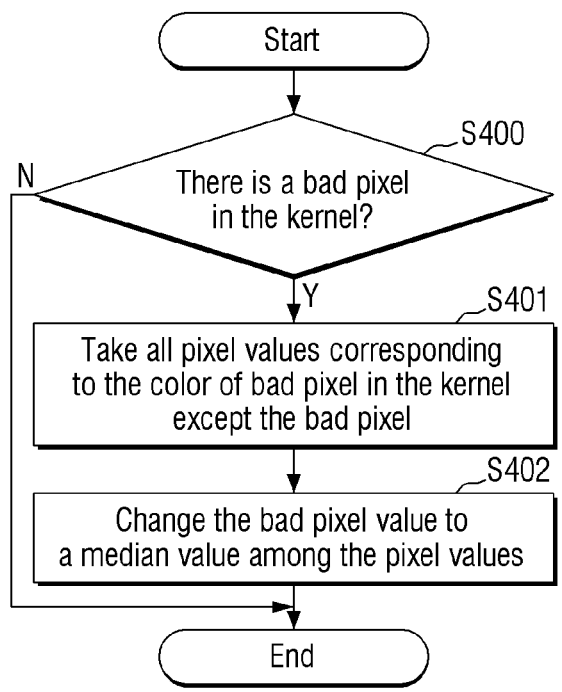
FIG. 9 is a flowchart for describing bad pixel correction in an image signal.

FIG. 8 is a block diagram for describing bad pixel correction in an image signal. FIG. 9 is a flowchart for describing bad pixel correction in an image signal.

Referring to FIGS. 8 and 9, the image signal IS may be converted into a bad pixel correction image signal IS_BPC. That is, the bad pixel correction module 211 may perform bad pixel correction on the image signal IS to generate the bad pixel correction image signal IS_BPC.

The bad pixel correction module 211 may set a first kernel K1 for the image signal IS. The image signal IS included in the first kernel K1 may include a first white pixel value W1, a first blue pixel value B1, a second white pixel value W2, a third blue pixel value B3, a fifth white pixel value W5, a third green pixel value G3, a ninth white pixel value W9, a fifth green pixel value G5, and a tenth white pixel value W10. Here, the first kernel K1 is illustrated to include only the pixel values described above, but the first kernel K1 may be moved to include other pixel values. Further, the size of the first kernel K1 may be not only a size of 3×3, but also a size of 7×7.

The bad pixel correction module 211 may determine whether a bad pixel BP exists in the first kernel K1 (S400). For example, the bad pixel correction module 211 may determine whether the bad pixel BP exists among the first white pixel value W1, the first blue pixel value B1, the second white pixel value W2, the third blue pixel value B3, the fifth white pixel value W5, the third green pixel value G3, the ninth white pixel value W9, the fifth green pixel value G5, and the tenth white pixel value W10.

When the bad pixel BP exists in the first kernel K1 (Y in S400), the bad pixel correction module 211 may obtain a pixel value corresponding to the color of the bad pixel BP in the first kernel K1 (S401). Here, the bad pixel correction module 211 may exclude a pixel value of the bad pixel BP in obtaining the pixel value corresponding to the color of the bad pixel BP in the first kernel K1.

For example, in FIG. 8, the pixel value of the bad pixel BP may be the fifth white pixel value W5. Further, the pixel values corresponding to the color of the bad pixel BP may include the first white pixel value W1, the second white pixel value W2, the ninth white pixel value W9, and the tenth white pixel value W10. However, embodiments according to the disclosure are not limited thereto.

Subsequently, the bad pixel correction module 211 may replace the pixel value of the bad pixel BP with a median value among pixel values corresponding to the color of the bad pixel BP (S402). That is, the fifth white pixel value W5', which is the pixel value of the corrected bad pixel BP, may be obtained by using the following equation.

$$W5' = \mathrm{median}(W1, W2, W9, W10)$$

For example, assuming the white pixel value W1, the second white pixel value W2, the ninth white pixel value W9, and the tenth white pixel value W10 are in a sequential order from the smallest pixel value to the largest pixel value, the fifth white pixel value W5' may be a median value such as the second white pixel value W2 or the ninth white pixel value W9. The fifth white pixel value W5' may correspond to a correction pixel CP.

Accordingly, prior to first conversion by the first converter 210, the deterioration of image quality may be prevented by correcting the pixel value of the bad pixel BP into a pixel value of the correction pixel CP. By utilizing the median value among the pixel values of other normal pixels corresponding to the color of the bad pixel BP, even when any one pixel value is extremely large or small, the pixel value of the bad pixel BP may be stably replaced.

Figure 10:
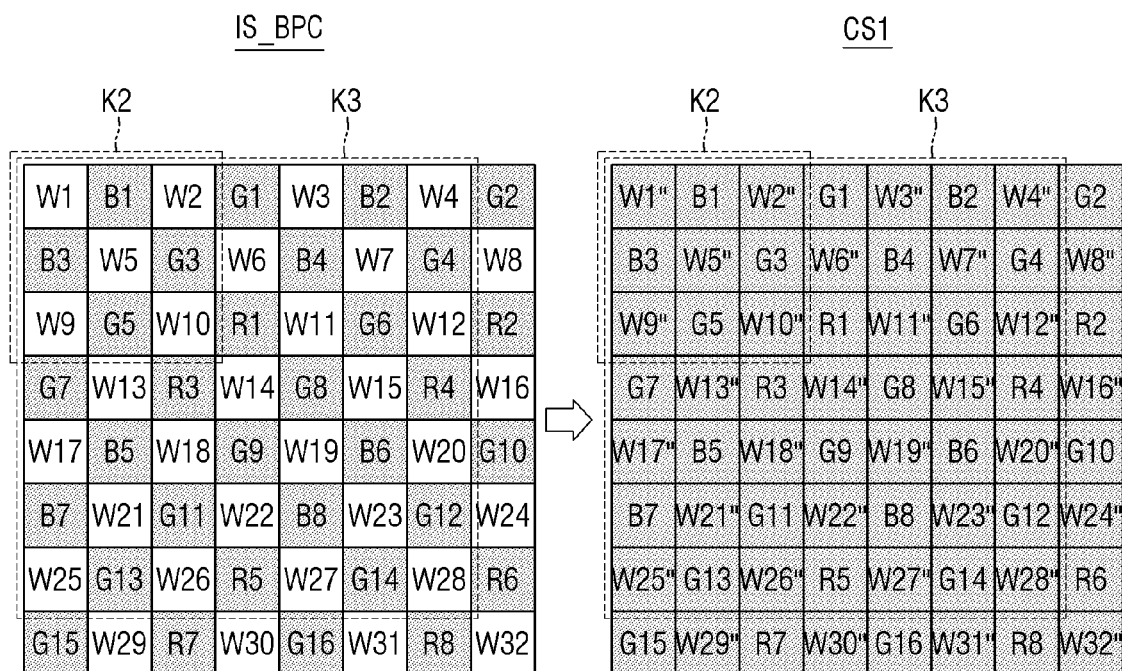
FIGS. 10, 11, and 12 are diagrams for describing a method of converting a bad pixel correction image signal into a first converted signal according to some example embodiments.
Figure 11:
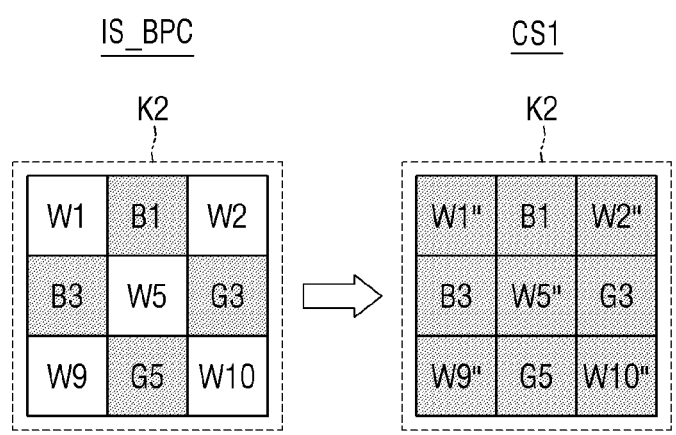
Figure 12:
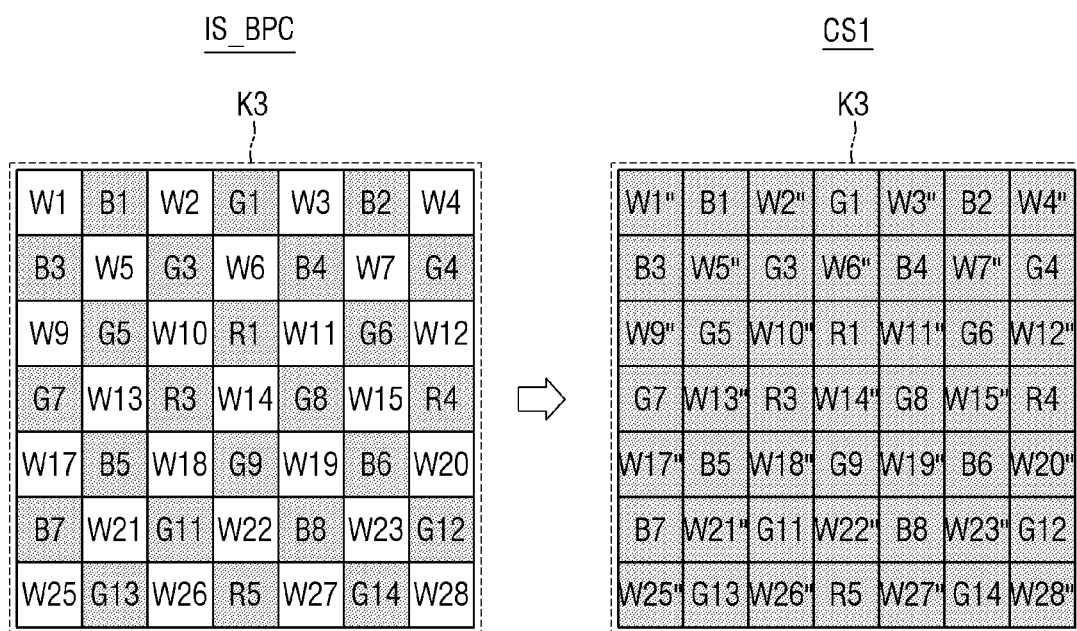

FIGS. 10 to 12 are diagrams for describing a method of converting a bad pixel correction image signal into a first converted signal.

Referring to FIG. 10, the bad pixel correction image signal IS_BPC may be converted into the first converted signal CS1. That is, the conversion module 212 may convert the bad pixel correction image signal IS_BPC into the first converted signal CS1.

The bad pixel correction image signal IS_BPC may have an RGBW Bayer pattern. That is, since the image signal IS has an RGBW Bayer pattern, the bad pixel correction image signal IS_BPC may also be an RGBW Bayer pattern. The first converted signal CS1 may have an RGB tetra pattern. That is, in the first converted signal CS1, four pixel values may correspond to one color (e.g., one of a red color, a green color, and a blue color). For example, a first converted pixel value W1" and a fifth converted pixel value W5" may correspond to a blue color, and a second converted pixel value W2" and a sixth converted pixel value W6" may correspond to a green color.

The conversion module 212 may set a second kernel K2 or a third kernel K3 on the bad pixel correction image signal IS_BPC. The second kernel K2 may have a size of 3×3, and the third kernel K3 may have a size of 7×7.

Referring to FIG. 11, the conversion module 212 may perform the first conversion using the second kernel K2. The bad pixel correction image signal IS_BPC included in the second kernel K2 may include the first white pixel value W1, the first blue pixel value B1, the second white pixel value W2, the third blue pixel value B3, the fifth white pixel value W5, the third green pixel value G3, the ninth white pixel value W9, the fifth green pixel value G5, and the tenth white pixel value W10.

Here, it is assumed that the pixel value to be converted is the fifth white pixel value W5. The fifth white pixel value W5 may be converted into the fifth converted pixel value W5" corresponding to a blue color. The fifth converted pixel value W5" may be obtained by using the following equation.

$$W5'' = W5 \cdot \frac{\mathrm{median}(B1, B2)}{\mathrm{median}(W1, W2, W9, W10)} \quad \text{[Equation 2]}$$

The fifth converted pixel value W5" may be generated based on the fifth white pixel value W5, a pixel value corresponding to a surrounding white color (e.g., the first white pixel value W1, the second white pixel value W2, the ninth white pixel value W9, and the tenth white pixel value W10), and a pixel value corresponding to a color to be converted (e.g., the first blue pixel value B1 and the second blue pixel value B2).

For example, the fifth converted pixel value W5" may be proportional to the fifth white pixel value W5, the first blue pixel value B1, and the second blue pixel value B2. Further, for example, the fifth converted pixel value W5" may be inversely proportional to the first white pixel value W1, the second white pixel value W2, the ninth white pixel value W9, and the tenth white pixel value W10. However, embodiments according to the disclosure are not limited thereto.

According to the conversion process, the image signal IS having an RGBW Bayer pattern or the bad pixel correction image signal IS_BPC may be converted into the first converted signal CS1 having an RGB tetra pattern.

Referring to FIG. 12, the conversion module 212 may perform the first conversion using the third kernel K3.

Here, it is assumed that the pixel value to be converted is a 14th white pixel value W14. The 14th white pixel value W14 may be converted into a 14th converted pixel value W14" corresponding to a red color. The 14th converted pixel value W14" may be obtained by using the following equation.

[Equation 3]
$$W14'' = W14 \cdot \frac{\text{median}(R1, R3, R4, R5)}{\text{median}(W1 \sim W7, W9 \sim W13, W15, W17 \sim W23, W25 \sim W28)}$$

The 14th converted pixel value W14" may be generated based on the 14th white pixel value W14, a pixel value corresponding to a surrounding white color (e.g., the first to seventh white pixel values W1 to W7, the ninth to 13th white pixel values W9 to W13, the 15th white pixel value W15, the 17th to 23rd white pixel values W17 to W23, and the 25th to 28th white pixel values W25 to W28), and a pixel value corresponding to a color to be converted (e.g., the first red pixel value R1, the third red pixel value R3, the fourth red pixel value R4, and the fifth red pixel value R5).

For example, the 14th converted pixel value W14" may be proportional to the 14th white pixel value W14, the first red pixel value R1, the third red pixel value R3, the fourth red pixel value R4, and the fifth red pixel value R5. Further, for example, the 14th converted pixel value W14" may be inversely proportional to the first to seventh white pixel values W1 to W7, the ninth to 13th white pixel values W9 to W13, the 15th white pixel value W15, the 17th to 23rd white pixel values W17 to W23, and the 25th to 28th white pixel values W25 to W28. However, embodiments according to the disclosure are not limited thereto.

According to the conversion process, the image signal IS having an RGBW Bayer pattern or the bad pixel correction image signal IS_BPC may be converted into the first converted signal CS1 having an RGB tetra pattern. Here, because the size of the third kernel K3 is larger than the size of the second kernel K2, the conversion module 212 may have more improved conversion performance.

Figure 13:
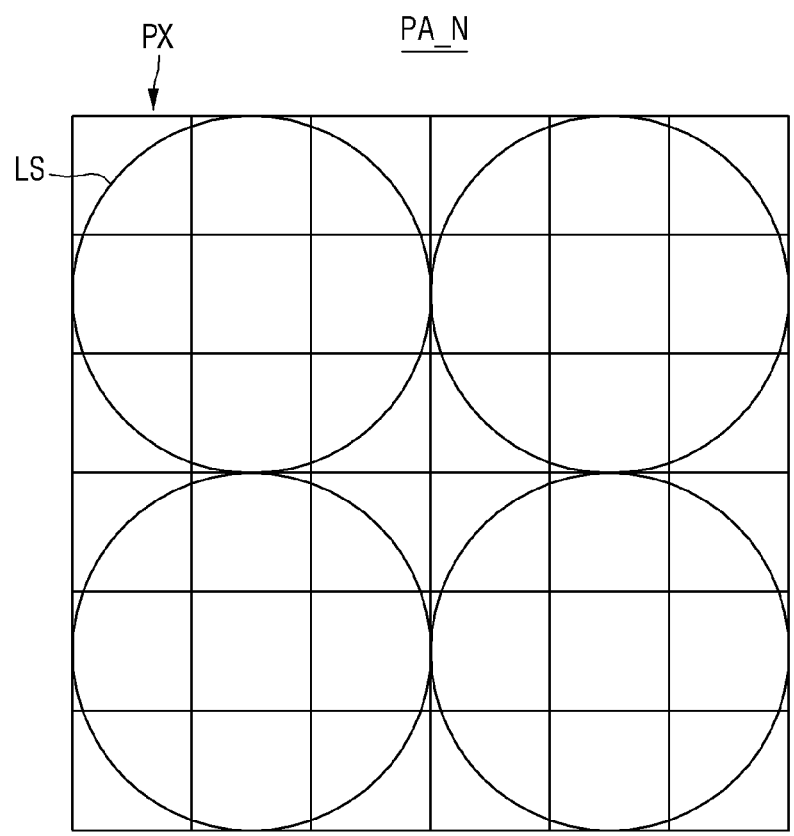
FIG. 13 is a diagram for describing a nona pixel array according to some example embodiments; embodiments.
Figure 15:
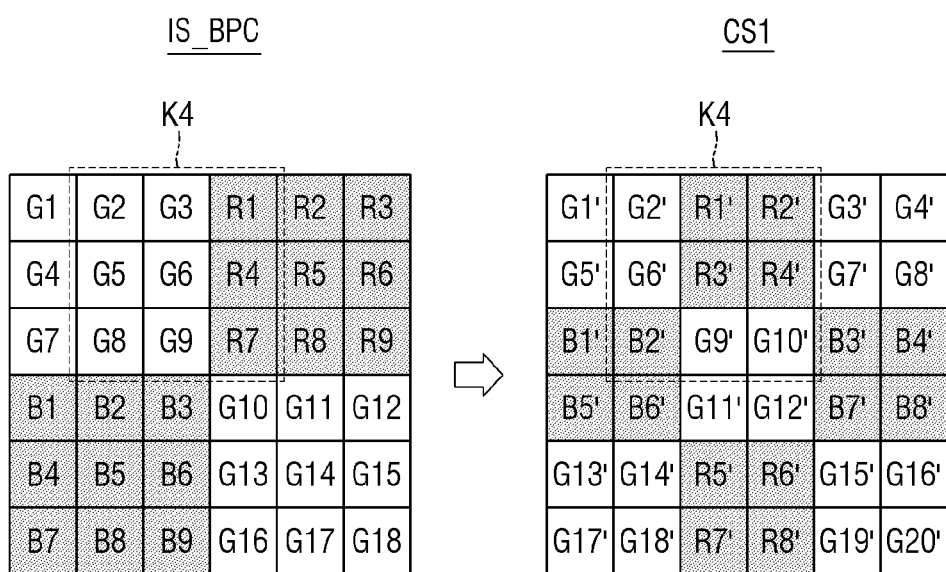
FIG. 15 is a diagram for describing a method of converting a bad pixel correction image signal into a first converted signal according to some example embodiments.

FIG. 13 is a diagram for describing a nona pixel array according to some example embodiments. FIG. 14 is a diagram for describing an image signal according to some example embodiments. FIG. 15 is a diagram for describing a method of converting a bad pixel correction image signal into a first converted signal according to some example embodiments.

Referring to FIG. 13, a nona pixel array PA_N may include a plurality of unit pixels PX. A lens LS may cover the plurality of unit pixels PX. For example, one lens LS may cover nine unit pixels PX. Further, the corresponding plurality of unit pixels PX may include the same type of color filter. For example, the plurality of unit pixels PX covered by one lens LS may include one of red, green, and blue color filters. Here, the color filter included in the nona pixel array PAN may be an RGB nona pattern. However, embodiments according to the disclosure are not limited thereto.

Referring to FIG. 14, the image signal IS may be a signal outputted by the image sensor 100 that senses light from the nona pixel array PA_N.

For example, the image signal IS may include the first to ninth green pixel values G1 to G9, the first to ninth red pixel values R1 to R9, the first to ninth blue pixel values B1 to B9, and the tenth to 18th green pixel values G10 to G18 that are outputted by sensing light transmitted through one lens LS.

Referring to FIG. 15, the bad pixel correction image signal IS_BPC obtained by performing bad pixel correction on the image signal IS may be converted into the first converted signal CS1. Here, the first converted signal CS1 may have an RGB tetra pattern.

The first converter 210 may set a fourth kernel K4 for the bad pixel correction image signal IS_BPC. Pixel values included in the fourth kernel K4 may be converted based on surrounding pixel values.

For example, when the sixth green pixel value G6 is to be converted to the third converted red pixel value R3', the third converted red pixel value R3' may be generated based on the second green pixel value G2, the third green pixel value G3, the fifth green pixel value G5, the eighth green pixel value G8, the ninth green pixel value G9. That is, the third converted red pixel value R3' may be a median value of the second green pixel value G2, the third green pixel value G3, the fifth green pixel value G5, the eighth green pixel value G8, and the ninth green pixel value G9.

Unlike the case described with reference to FIGS. 8 to 12, even when the image signal IS has an RGB nona pattern, the first converted signal CS that has been converted may have an RGB tetra pattern. That is, even when the pixel array PA of the image sensor 100 is replaced with one having a different color filter, the first converter 210 may convert the image signal IS into the first converted signal CS having a specific pattern. For example, the first converter 210 may convert the image signal IS having a first pattern into the first converted signal CS1 having a second pattern.

Figure 16:
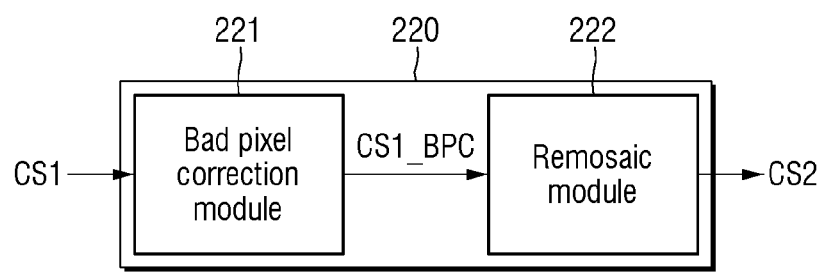
FIG. 16 is a block diagram illustrating a second converter of FIG. 6.
Figure 17:
FIG. 17 is a diagram for describing a method of converting a first converted signal to a second converted signal.

FIG. 16 is a block diagram illustrating a second converter of FIG. 6. FIG. 17 is a diagram for describing a method of converting a first converted signal to a second converted signal.

Referring to FIG. 16, the second converter 220 may include a bad pixel correction module 221 and a remosaic module 222. However, embodiments according to the disclosure are not limited thereto, and the second converter 220 may include only the remosaic module 222.

The first converted signal CS1 may be converted into a first bad pixel correction converted signal CS1_BPC by the bad pixel correction module 221 that performs bad pixel correction. The first bad pixel correction converted signal CS_BPC may be converted into the second converted signal CS2 by the remosaic module 222. The bad pixel correction module 221 may perform bad pixel correction on the first converted signal CS1 through the same process as the bad pixel correction module 211 described above.

Referring to FIG. 17, the first converted signal CS1 may be converted into the second converted signal CS2. The first converted signal CS1 may have an RGB tetra pattern, and the second converted signal CS2 may have an RGW Bayer pattern. That is, the second converter 220 may convert the first converted signal CS1 having the second pattern into the second converted signal CS2 having a third pattern. For example, when the second pattern is an RGB tetra pattern, the third pattern may be an RGB Bayer pattern. Here, the conversion of the second pattern to the third pattern may be implemented using an existing algorithm, but embodiments according to the disclosure are not limited thereto.

The second converted signal CS2 having an RGB Bayer pattern converted by the second converter 220 may be provided to the application processor 300. That is, the second converted signal CS2 having an RGB Bayer pattern converted by the second converter 220 may be provided to the second image signal processor 310.

The second image signal processor 310 may perform image processing on the second converted signal CS2 having an RGB Bayer pattern. For example, the second image signal processor 310 may perform demosaic, edge enhancement, gamma correction, white balance compensation, and color correction on the second converted signal CS2. The second converted signal CS2 on which image processing has been performed by the second image signal processor 310 may be provided to a display and the like.

Here, the application processor 300 may process an image signal having an RGB Bayer pattern. That is, in the related art, the application processor 300 may process only the image signal having an RGB Bayer pattern, and when the pixel array PA of the image sensor 100 is changed, the application processor 300 may have to be newly designed.

For example, conversion of an image signal having an RGB tetra pattern into an image signal having an RGB Bayer pattern may be implemented by the existing application processor 300. Accordingly, according to an example embodiment, the first image signal processor 200 may convert the image signal IS into an image signal having a specific pattern (e.g., the first converted signal CS1), so that the application processor 300 may use the second converted signal CS2 converted from the first converted signal CS1 by the second converter 220.

That is, even when the pixel array PA of the image sensor 100 is changed, by changing the design of the first converter 210 or the second converter 220, image processing may be performed on the image signal IS from the image sensor 100 without changing the design of the application processor 300.

Figure 18:
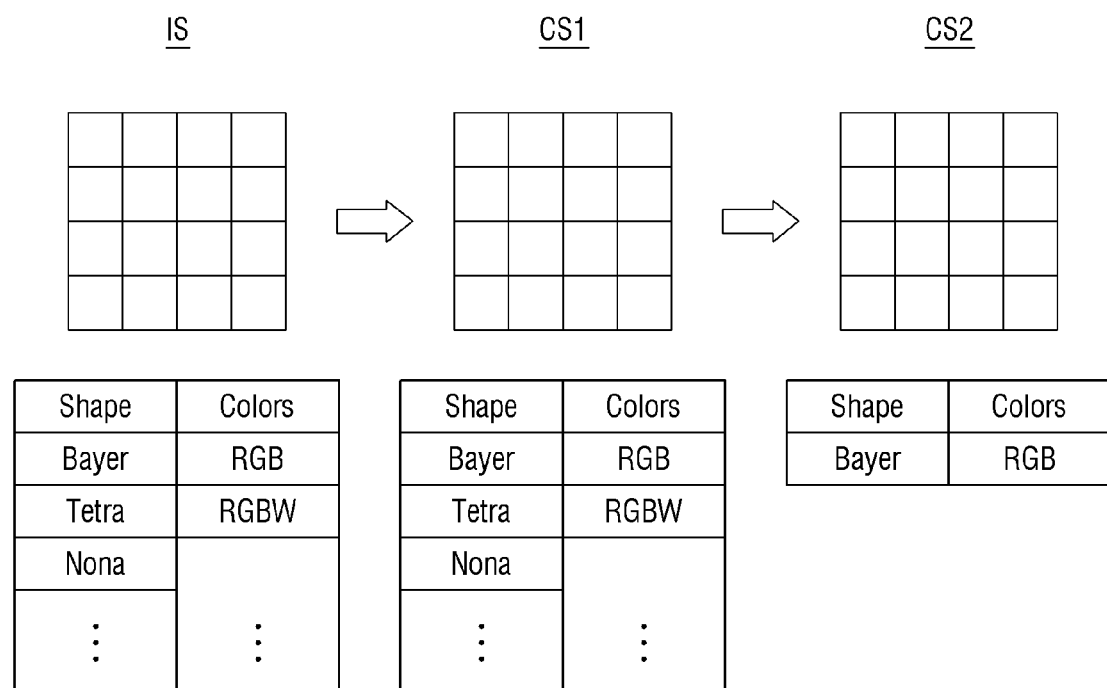
FIG. 18 is a diagram for describing a method of converting an image signal into a first converted signal and a second converted signal according to some example embodiments.

FIG. 18 is a diagram for describing a method of converting an image signal into first and second converted signals according to some example embodiments.

Referring to FIG. 18, the image signal IS and the first converted signal CS1 may have various types of patterns. The image signal IS and the first converted signal CS1 may have a pattern of a combination of pixels, each pixel including color information and brightness information. For example, the first pattern of the image signal IS may correspond to a combination of an arrangement including Bayer, tetra, nona, and the like and a color including RGB, RGBW, and the like. That is, the color filter of the image sensor 100 may have the first pattern.

Further, for example, the second pattern of the first converted signal CS1 may correspond to a combination of an arrangement including Bayer, tetra, nona, and the like and a color including RGB, RGBW, and the like. That is, the image signal IS having the first pattern may be converted into the first converted signal CS1 having the second pattern.

Further, for example, the third pattern of the second converted signal CS2 may be a Bayer RGB pattern. That is, the pattern of the second converted signal CS2 used by the application processor 300 may be a Bayer RGB pattern.

That is, the types of patterns of the image signal IS and the first converted signal CS1 are not limited and may be changed according to design. On the other hand, the pattern of the second converted signal CS2 may be fixed. However, the embodiment according to the disclosure is not limited thereto, and the second converted signal CS2 may also be designed to have a different pattern.

Hereinafter, an image sensing system 2 according to some other example embodiments will be described with reference to FIG. 19.

Figure 19:
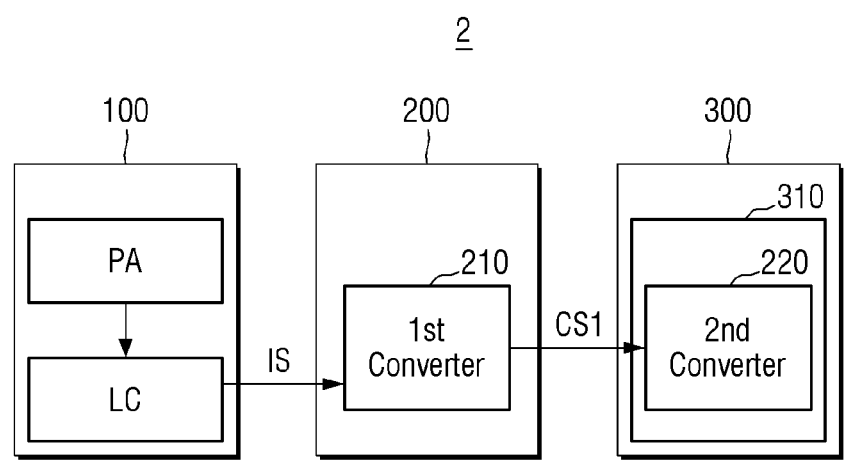
FIG. 19 is a block diagram of an image sensing system according to some other example embodiments.

FIG. 19 is a block diagram of an image sensing system according to some other example embodiments. For simplicity of description, redundant parts of the description made with reference to FIGS. 1 to 18 may be recapitulated or omitted.

Referring to FIG. 19, the image sensing system 2 may include the image sensor 100, the first image signal processor 200, and the application processor 300. The first image signal processor 200 may include the first converter 210, and the second image signal processor 310 may include the second converter 220.

That is, in the image sensing system 2, unlike the image sensing system 1 described with reference to FIGS. 1 to 18, the second converter 220 may be included in the application processor 300. That is, a process of converting the first converted signal CS1 to the second converted signal CS2 by the second converter 220 may be implemented by the application processor 300.

Unlike the operation of the first converter 210 that changes according to the change of the design of the first image signal processor 200, the operation of the second converter 220 may not change. That is, the second converter 220 may be included in the application processor 300, so that the design of the second converter 220 may not be changed. Further, since the performance of the application processor 300 may be higher than the performance of the first image signal processor 200, when the conversion from the first converted signal CS1 to the second converted signal CS2 is implemented by the application processor 300, the performance of the image sensing system 2 may be further improved.

Hereinafter, an image sensing system 3 according to some other example embodiments will be described with reference to FIG. 20.

Figure 20:
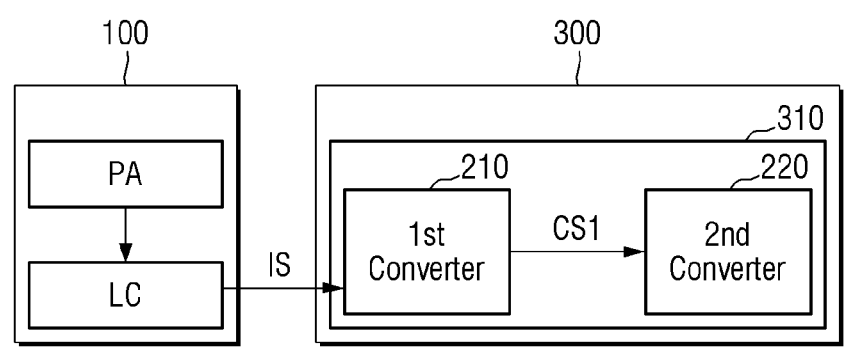
FIG. 20 is a block diagram of an image sensing system according to some other example embodiments.

FIG. 20 is a block diagram of an image sensing system according to some other example embodiments. For simplicity of description, redundant parts of the description made with reference to FIGS. 1 to 18 may be recapitulated or omitted.

Referring to FIG. 20, the first converter 210 and the second converter 220 may be included in the application processor 300. That is, FIG. 20 may not include the first image signal processor 200 outside the application processor 300.

The operation of the first converter 210 and the second converter 220 may be implemented by the application processor 300. For example, the operation of converting the image signal IS to the first converted signal CS1 and the operation of converting the first converted signal CS1 to the second converted signal CS2 may be implemented by the application processor 300.

Since the performance of the application processor 300 may be higher than the performance of the existing first image signal processor 200, when the conversion from the image signal IS to the first converted signal CS1 and the conversion from the first converted signal CS1 to the second converted signal CS2 are implemented by the application processor 300, the performance of the image sensing system 3 may be further improved.

Hereinafter, an image sensing system 4 according to some other example embodiments will be described with reference to FIG. 21.

Figure 21:
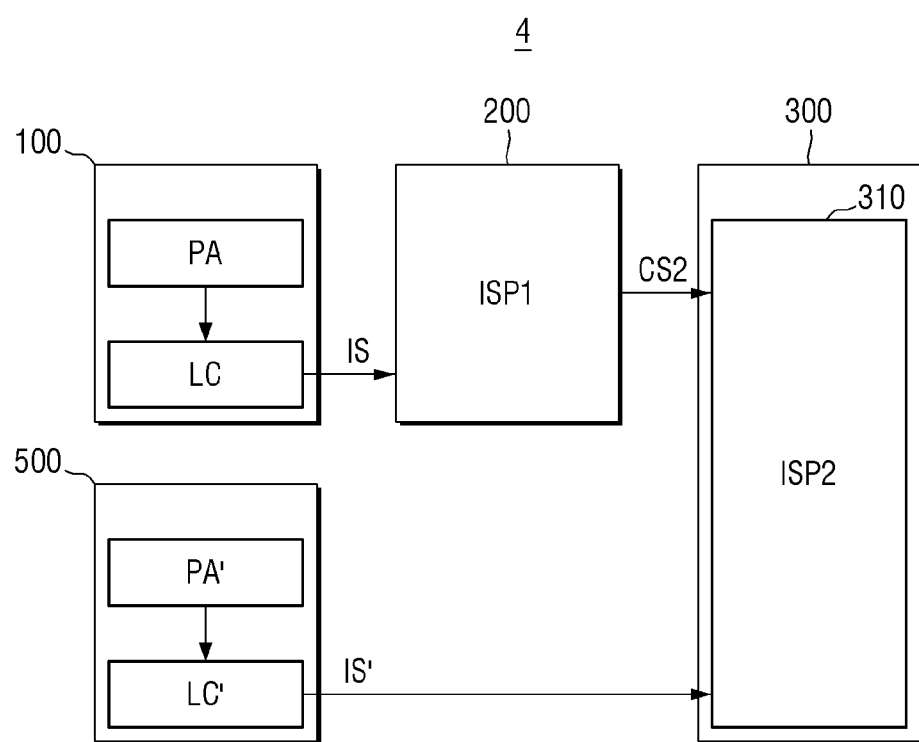
FIG. 21 is a block diagram of an image sensing system according to some other example embodiments.

FIG. 21 is a block diagram of an image sensing system according to some other example embodiments. For simplicity of description, redundant parts of the description made with reference to FIGS. 1 to 18 may be recapitulated or omitted.

Referring to FIG. 21, the image sensing system 4 may include the image sensor 100, an image sensor 500, the first image signal processor 200, and the application processor 300.

The image sensor 500 may include a pixel array PA' and a logic circuit area LC'. The image signal IS' may be transmitted from the logic circuit area LC' to the second image signal processor 310 of the application processor 300. In this case, the image signal IS' may be transmitted to the application processor 300 without passing through the first image signal processor 200.

For example, a color filter included in the pixel array PA' may have an RGB Bayer pattern. That is, the image signal IS' outputted from the image sensor 500 may correspond to an RGB Bayer pattern. That is, unlike the image signal IS that is outputted from the image sensor 100, converted to the second converted signal CS2 through the first image signal processor 200, and provided to the application processor 300, the image signal IS' may be provided directly to the application processor 300. That is, the pattern corresponding to the image signal IS' may be the same as the pattern corresponding to the second converted signal CS2.

Accordingly, the image processing of the image signal IS' may be performed by the second image signal processor 310 without the need for a conversion process.

Hereinafter, an image sensing system 5 according to some other example embodiments will be described with reference to FIG. 22.

Figure 22:
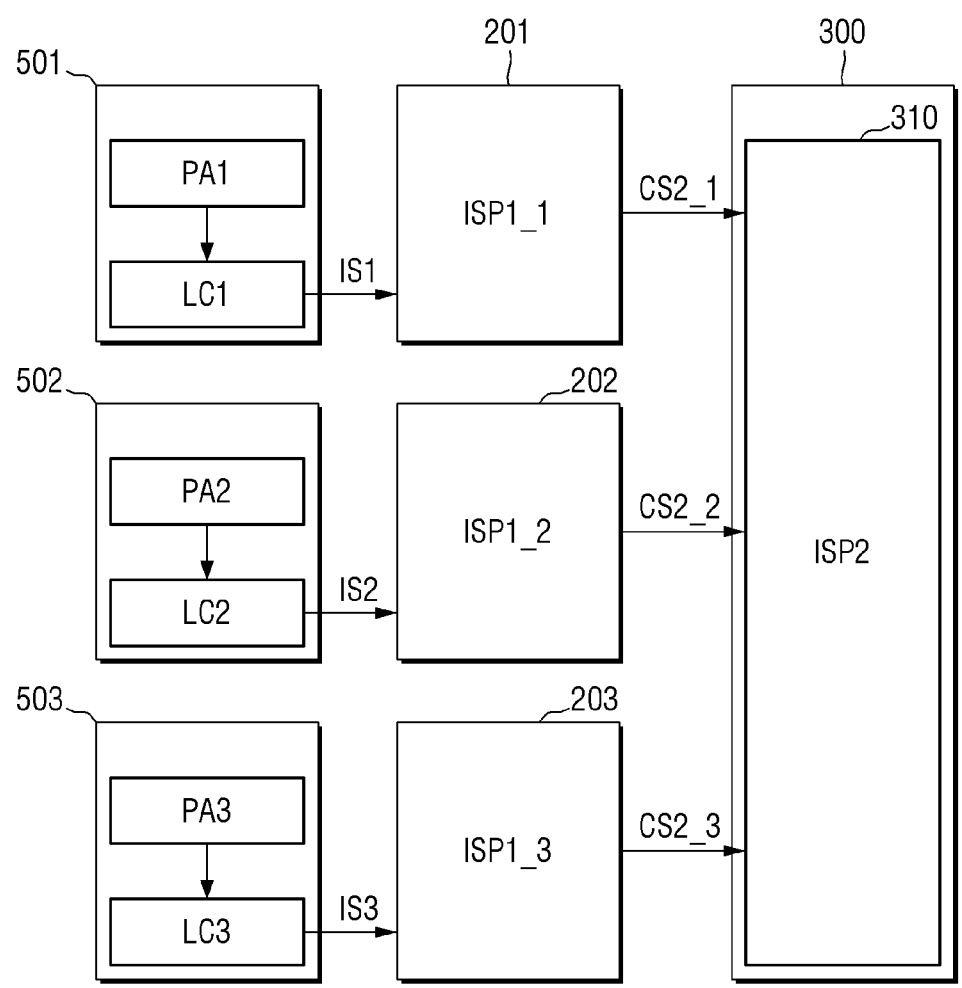
FIG. 22 is a block diagram of an image sensing system according to some other example embodiments.

FIG. 22 is a block diagram of an image sensing system according to some other example embodiments. For simplicity of description, redundant parts of the description made with reference to FIGS. 1 to 18 may be recapitulated or omitted.

Referring to FIG. 22, the image sensing system 5 may include a first image sensor 501, a second image sensor 502, a third image sensor 503, an image signal processor 201, an image signal processor 202, an image signal processor 203, and the application processor 300.

The first image sensor 501, the second image sensor 502, and the third image sensor 503 may be the same as the image sensor 100, and the image signal processor 201, the image signal processor 202, and the image signal processor 203 may be the same as the first image signal processor 200 (e.g., the first image signal processor 200 including the first converter 210 and the second converter 220, as illustrated in FIG. 6).

The image signal processor 201 may provide a second converted signal CS2_1 obtained by converting the image signal IS1 provided from the first image sensor 501, to the application processor 300. The image signal processor 202 may provide a second converted signal CS2_2 obtained by converting an image signal IS2 provided from the second image sensor 502, to the application processor 300. The image signal processor 203 may provide a second converted signal CS2_3 obtained by converting an image signal IS3 provided from the third image sensor 503, to the application processor 300.

Here, the image signal IS1, the image signal IS2, and the image signal IS3 may all correspond to different patterns. Further, the second converted signal CS2_1, the second converted signal CS2_2, and the second converted signal CS2_3 may all correspond to the same pattern. That is, even when the signals outputted from each of the first image sensor 501, the second image sensor 502, and the third image sensor 503 correspond to different patterns, the second converted signal CS2_1, the second converted signal CS2_2, and the second converted signal CS2_3 may all correspond to a common pattern.

Hereinafter, an image sensing system 6 according to some other example embodiments will be described with reference to FIG. 23.

Figure 23:
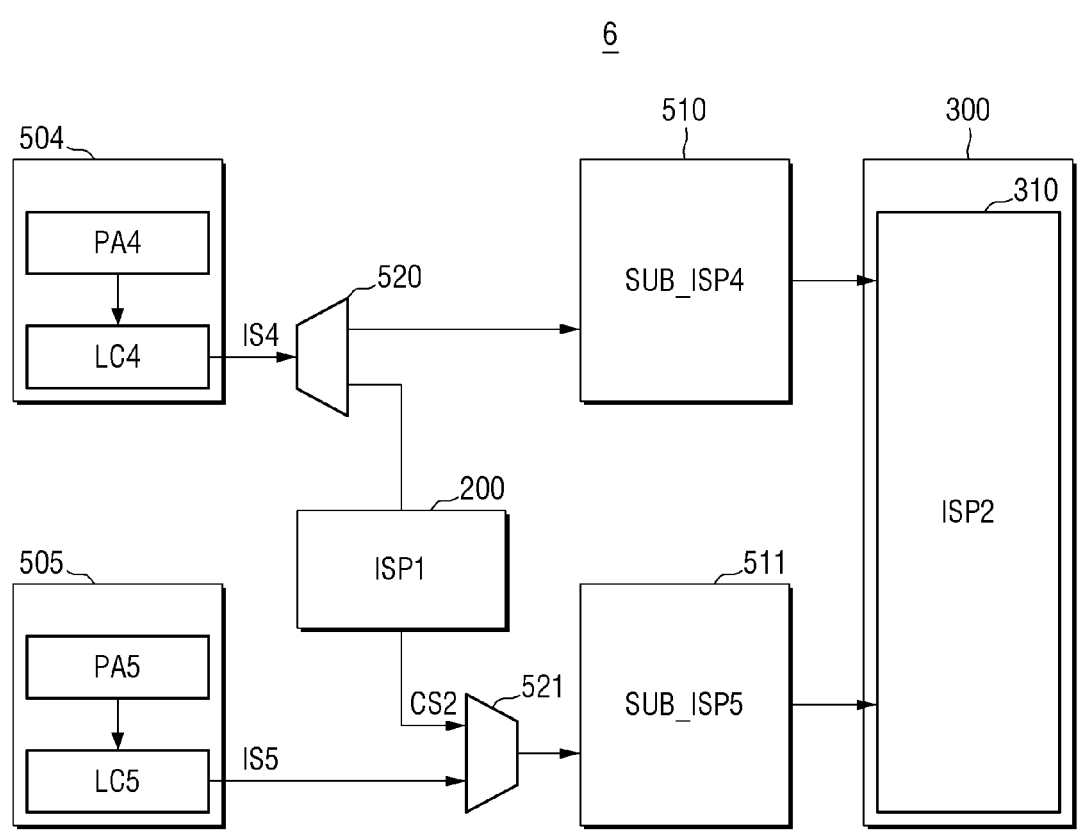
FIG. 23 is a block diagram of an image sensing system according to some other example embodiments.

FIG. 23 is a block diagram of an image sensing system according to some other example embodiments. For simplicity of description, redundant parts of the description made with reference to FIGS. 1 to 18 may be recapitulated or omitted.

Referring to FIG. 23, the image sensing system 6 may include an image sensor 504, an image sensor 505, a sub-image signal processor 510, a sub-image signal processor 511, the first image signal processor 200, a first determiner 520, a second determiner 521, and the application processor 300. The image sensor 504 and the image sensor 505 may be the same as the image sensor 100.

The sub-image signal processor 510 may perform image processing on an image signal IS4 provided from the image sensor 504. That is, the sub-image signal processor 510 may provide the image signal IS4 on which image processing is performed, to the application processor 300.

The sub-image signal processor 511 may perform image processing on an image signal IS5 provided from the image sensor 505. That is, the sub-image signal processor 511 may provide the image signal IS5 on which image processing is performed, to the application processor 300.

Here, the sub-image signal processor 510 and the sub-image signal processor 511 may perform the conversion from the image signal IS described with reference to FIGS. 1 to 18 into the second converted signal CS2.

Here, the first determiner 520 may determine which one of the sub-image signal processor 510 and the first image signal processor 200 the image signal IS4 provided from the image sensor 504 is to be transmitted to. For example, unless the image signal IS4 requires excessive image processing, the first determiner 520 may provide the image signal IS4 to the first image signal processor 200.

The second determiner 521 may transmit the second converted signal CS2 converted by the first image signal processor 200 to the sub-image signal processor 511 only when the image signal IS5 is not provided from the image sensor 505. That is, the second converted signal CS2 may be image-processed by the sub-image signal processor 511.

When the image sensor 504 is included in a front camera module and the image sensor 505 is included in a rear camera module, the performance of the sub-image signal processor 510 may not be higher than the performance of the sub-image signal processor 511. Accordingly, the performance of the image sensing system 6 may be improved by transmitting the second converted signal CS2 obtained by converting the image signal IS4 to the sub-image signal processor 511 only when the image signal IS5 is not provided from the image sensor 505.

Hereinafter, an electronic device 1000 according to some other example embodiments will be described with reference to FIG. 24.

Figure 24:
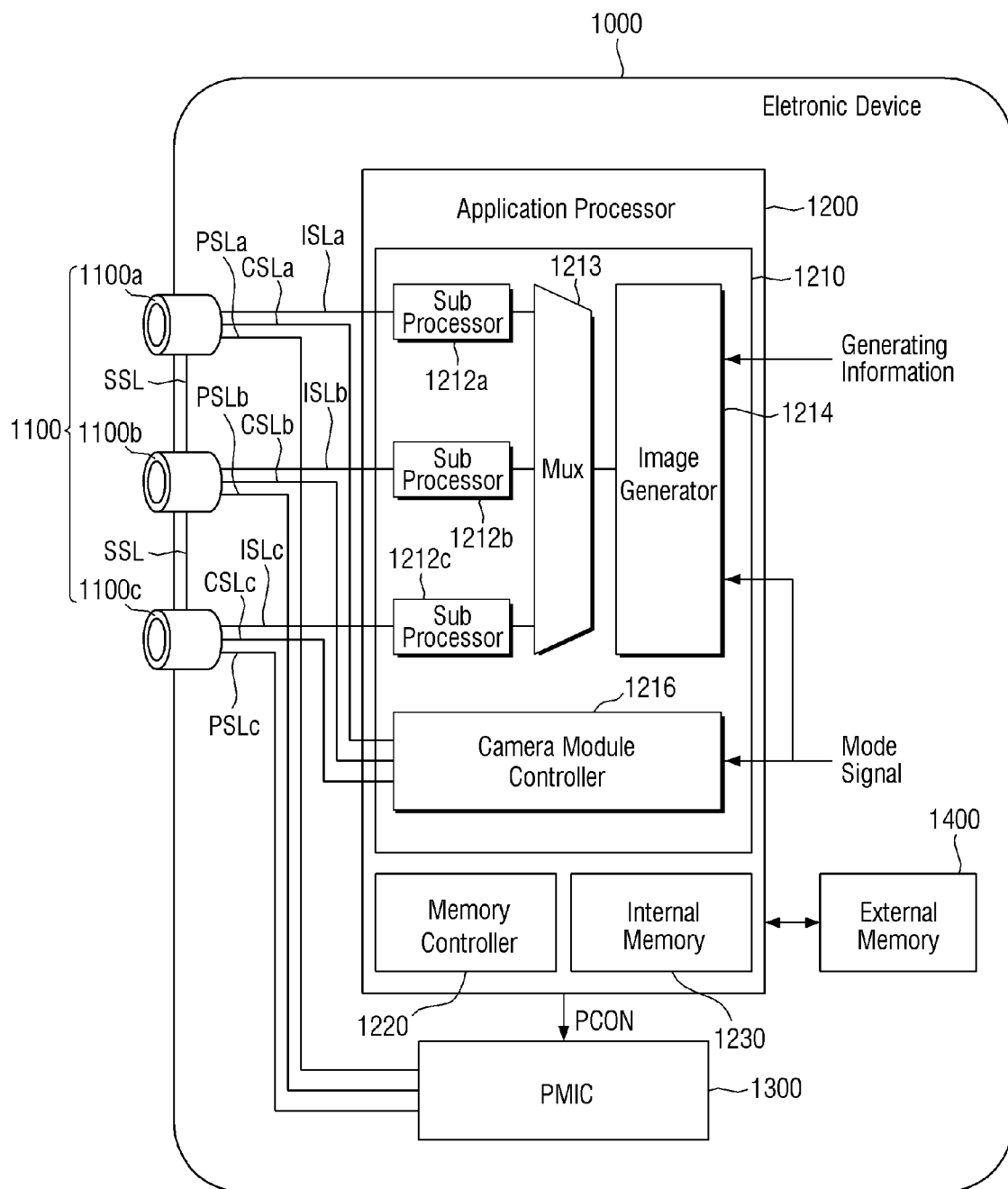
FIG. 24 is a block diagram illustrating an electronic device including a multi-camera module according to some example embodiments.

FIG. 24 is a block diagram illustrating an electronic device including a multi-camera module according to some example embodiments.

Referring to FIG. 24, the electronic device 1000 may include a camera module group 1100, an application processor 1200, a power management integrated circuit (PMIC) 1300, and an external memory 1400. For example, electronic devices may include mobile communication terminals such as smartphones and tablet computers.

The camera module group 1100 may include first to third camera modules 1100a, 1100b, and 1100c. In an example embodiment, the camera module group 1100 is illustrated as including the three camera modules 1100a, 1100b, and 1100c, but is not limited thereto. In some embodiments, the camera module group 1100 may be implemented to include only two camera modules, or to include n (n is a natural number of 4 or more) camera modules.

Among the camera modules 1100a, 1100b, and 1100c, at least two camera modules (e.g., camera modules 1100b and 1100c) may have different fields of view (viewing angles). In this case, the optical lenses of at least two camera modules (e.g., 1100b and 1100c) among the first to third camera modules 1100a, 1100b, and 1100c may be different from each other.

In some embodiments, the first to third camera modules 1100a, 1100b, and 1100c may have different viewing angles. For example, the first camera module 1100a may be a tele camera, the second camera module 1100b may be a wide camera, and the third camera module 1100c may be an ultrawide camera. In this case, the optical lenses of each of the plurality of camera modules 1100a, 1100b, and 1100c may be different from each other.

In some embodiments, one camera module (e.g., 1100b) among the first to third camera modules 1100a, 1100b, and 1100c may be a camera module in the form of a folded lens including a prism and an optical path folding element (OPFE), and the other camera modules (e.g., 1100a and 1100c) may not include a prism and an OPFE and may be a vertical type camera module, but are not limited thereto and may be implemented in different forms and combinations.

In some embodiments, one camera module (e.g., camera module 1100a) among the first to third camera modules 1100a, 1100b and 1100c may be a depth camera of a vertical type that extracts depth information using, for example, infrared rays (IR). In this case, the application processor 1200 may merge image data provided from the depth camera with image data provided from another camera module (e.g., camera module 1100b or 1100c) to generate a three dimensional (3D) depth image.

The first to third camera modules 1100a, 1100b, and 1100c employed in an example embodiment may be disposed to be physically separate from each other. Specifically, the sensing area of one image sensor may be not divided and used by the plurality of camera modules 1100a, 1100b, and 1100c, but each of the first to third camera modules 1100a, 1100b, and 1100c may be disposed with an independent image sensor. An image sensor of one of the first to third camera modules 1100a, 1100b, and 1100c may have a pixel array structure different from that of an image sensor of the other one of the first to third camera modules 1100a, 1100b, and 1100c.

Further, one camera module of the first to third camera modules 1100a, 1100b, and 1100c may include a first image sensor having an RGB pixel array constituted with a red (R) pixel, a green (G) pixel, and a blue (B) pixel, and the remaining camera modules may include an RGBW pixel array constituted with RGB pixels and a white (W) pixel.

In an example embodiment, the first camera module 1100a and the third camera module 1100c may include an image sensor having an RGB pixel array, and the second camera module 1100b may include an image sensor having an RGBW pixel array.

The application processor 1200 may include an image processor 1210, a memory controller 1220, and an internal memory 1230. The application processor 1200 and the plurality of camera modules 1100a, 1100b, and 1100c may be implemented separately as separate semiconductor chips.

The image processor 1210 may include first to third sub-image processors 1212a, 1212b, and 1212c, an image generator 1214, and a camera module controller 1216. The image processor 1210 may include the first to third sub-image processors 1212a, 1212b, and 1212c, the number of which corresponds to the number of the first to third camera modules 1100a, 1100b, 1100c.

Image data generated from the first camera module 1100a may be provided to the first sub-image processor 1212a through an image signal line ISLa, image data generated from the second camera module 1100b may be provided to the second sub-image processor 1212b through an image signal line ISLb, and image data generated from the third camera module 1100c may be provided to the third sub-image processor 1212c through an image signal line ISLc. For example, such image data transmission may be performed using a camera serial interface (CSI) based on a mobile industry processor interface (MIPI).

On the other hand, in some embodiments, a plurality of sub-image processors corresponding to a plurality of camera modules may be implemented as one sub-image processor. For example, the first to third sub-image processors 1212a, 1212b, and 1212c are illustrated as separate blocks in FIG. 24, but may be implemented by being integrated into one sub-image processor. Further, the first sub-image processor 1212a and the third sub-image processor 1212c may be integrated into one sub-image processor, and the image data provided from the first camera module 1100a and the third camera module 1100c may be selected by a multiplexer (MUX) 1213, which is a selection element, and then provided to the integrated sub-image processor. In this case, the sub-image processor 1212b may not be integrated, and may be provided with the image data from the second camera module 1100b.

Further, in some embodiments, image data generated from the first camera module 1100a may be provided to the first sub-image processor 1212a through the image signal line ISLa, image data generated from the second camera module 1100b may be provided to the second sub-image processor 1212b through the image signal line ISLb, and image data generated from the third camera module 1100c may be provided to the third sub-image processor 1212c through the image signal line ISLc. Further, the image data processed by the second sub-image processor 1212b may be directly provided to the image generator 1214, but any one of the image data processed by the first sub-image processor 1212a and the image data processed by the third sub-image processor 1212c may be selected through the multiplexer 1213 and then provided to the image generator 1214.

Each of the first to third sub-image processors 1212a, 1212b and 1212c may perform image processing such as bad pixel correction, 3A (auto-focus correction, auto-white balance, auto-exposure) adjustment, noise reduction, sharpening, gamma control, and remosaic on the image data provided from the first to third camera modules 1100a, 1100b, and 1100c.

In some embodiments, remosaic signal processing may be performed in each of the camera modules 1100a, 1100b, and 1100c, and then provided to the first to third sub-image processors 1212a, 1212b, and 1212c. The image data processed by the first to third sub-image processors 1212a, 1212b, and 1212c may be provided to the image generator 1214. For example, the first image signal processor 200 according to the disclosure may be included in the camera modules 1100a, 1100b, 1100c, and the first image signal processor 200 may provide the first to third sub-image processors 1212a, 1212b, 1212c with the processed image data.

The image generator 1214 may generate a target image using the image data provided from each of the sub-image processors 1212a, 1212b, and 1212c according to image generating information or a mode signal.

Specifically, the image generator 1214 may generate an output image by merging at least some of the image data generated from the image processors 1212a, 1212b, and 1212c according to the image generation information or the mode signal. Further, the image generator 1214 may generate a target image by selecting any one of the image data generated from the first to third image processors 1212a, 1212b, and 1212c according to the image generation information or the mode signal. The mode signal indicates a mode among a plurality of various modes, and may be selected by a user or determined by an external environment.

The plurality of various modes may control the first to third camera modules 1100a, 1100b, and 1100c through the camera module controller 1216 as well as the image generator 1214. Control signals provided from the camera module controller 1216 to the first to third camera modules 1100a, 1100b, and 1100c may include information according to the selected mode.

The modes employed in some embodiments may include a plurality of still image modes and a plurality of video modes, and the camera module group 1100 of the electronic device 1000 according to an example embodiment may operate differently according to the signal of a selected mode among the plurality of modes.

In some example embodiments, the plurality of modes may include first to third still image modes and first and second video modes. The plurality of modes may be described as an operation (in particular, output) of the second camera module 1100b, which is a wide camera, according to a corresponding control signal. Unlike the image sensors of the first and third camera modules 1100a and 1100c, the second camera module 1100b may include an image sensor having an RGBW pixel array.

On the other hand, the image generation information may include, for example, a zoom signal or zoom factor. The zoom signal may be, for example, a signal selected from a user.

When the image generating information is a zoom signal (or zoom factor), and the first to third camera modules 1100a, 1100b, and 1100c have different fields of view (viewing angles), and the image generator 1214 may perform a different operation depending on the type of the zoom signal.

For example, when the zoom signal is a first signal, an output image may be generated by using the image data outputted from the first sub-image processor 1212a, among the image data outputted from the first sub-image processor 1212a and the image data outputted from the third sub-image processor 1212c, and the image data outputted from the second sub-image processor 1212b.

When the zoom signal is a second signal different from the first signal, the image generator 1214 may generate an output image by using the image data outputted from the third sub-image processor 1212c, among the image data outputted from the first sub-image processor 1212a and the image data outputted from the third sub-image processor 1212c, and the image data outputted from the second sub-image processor 1212b.

When the zoom signal is a third signal from the first and second signals, the image generator 1214 may not perform image data merging, and may generate an output image by selecting any one of image data outputted from each of the sub-image processors 1212a, 1212b, and 1212c. In addition to the above-described generation process, a method of processing image data in a different generation process according to other zoom signals may be variously modified and implemented.

The camera control signal according to the selection of the mode may be provided to each of the camera modules 1100a, 1100b, and 1100c by the camera module controller 1216. The control signals generated from the camera module controller 1216 may be provided to the corresponding first to third camera modules 1100a, 1100b, and 1100c through control signal lines CSLa, CSLb, and CSLc that are separate from each other.

Any one (e.g., camera module 1100b) of the first to third camera modules 1100a, 1100b and 1100c may be designated as a master camera according to the mode signal or the image generating information including the zoom signal, and the remaining camera modules (e.g., camera modules 1100a and 1100c) may be designated as slave cameras. Such information may be included in the control signals to be provided to the corresponding first to third camera modules 1100a, 1100b, and 1100c through the control signal lines CSLa, CSLb, and CSLc that are separate from each other.

The PMIC 1300 may supply power, such as a source voltage, to each of the first to third camera modules 1100a, 1100b, and 1100c. For example, the PMIC 1300 may supply first power to the first camera module 1100a through a power signal line PSLa, second power to the second camera module 1100b through a power signal line PSLb and third power to the third camera module 1100c through a power signal line PSLc under the control of the application processor 1200.

The PMIC 1300 may generate power corresponding to each of the first to third camera modules 1100a, 1100b, and 1100c in response to a power control signal PCON from the application processor 1200, and may also adjust a power level. The power control signal PCON may include a power adjustment signal for each operation mode of the plurality of camera modules 1100a, 1100b, and 1100c. For example, the operation mode may include a low power mode, and in this case, the power control signal PCON may include information on a camera module that operates in the low power mode and a set power level. Levels of powers provided to the respective first to third camera modules 1100a, 1100b, and 1100c may be the same or different. Further, the levels of powers may be dynamically changed.

At least one of the components, elements, modules or units described herein may be embodied as various numbers of hardware, software and/or firmware structures that execute respective functions described above, according to an example embodiment. For example, at least one of these components, elements or units may use a direct circuit structure, such as a memory, a processor, a logic circuit, a look-up table, etc. that may execute the respective functions through controls of one or more microprocessors or other control apparatuses. Also, at least one of these components, elements or units may be specifically embodied by a module, a program, or a part of code, which contains one or more executable instructions for performing specified logic functions, and executed by one or more microprocessors or other control apparatuses. Also, at least one of these components, elements or units may further include or implemented by a processor such as a central processing unit (CPU) that performs the respective functions, a microprocessor, or the like. Two or more of these components, elements or units may be combined into one single component, element or unit which performs all operations or functions of the combined two or more components, elements of units. Also, at least part of functions of at least one of these components, elements or units may be performed by another of these components, element or units. Further, although a bus is not illustrated in the block diagrams, communication between the components, elements or units may be performed through the bus. Functional aspects of the above example embodiments may be implemented in algorithms that execute on one or more processors. Furthermore, the components, elements or units represented by a block or processing operations may employ any number of related art techniques for electronics configuration, signal processing and/or control, data processing and the like.

While the disclosure has been particularly shown and described with reference to example embodiments thereof, it will be understood that various changes in form and details may be made therein without departing from the spirit and scope of the following claims.

What is claimed is:

1. A camera module comprising:
a pixel array including color filters having a first pattern, the pixel array being configured to sense light incident on the pixel array to generate a first pattern image signal having the first pattern;
a first converter configured to convert the first pattern image signal into a second pattern image signal having a second pattern that is different from the first pattern and includes an RGB color pattern;
a second converter configured to convert the second pattern image signal into a third pattern image signal having a third pattern that is different from the first pattern and the second pattern; and
an interface configured to communicate with an external application processor,
wherein the pixel array includes white pixels.

2. The camera module of claim 1, wherein the third pattern includes an RGB Bayer pattern.

3. The camera module of claim 2, wherein the second pattern image signal does not include a pixel value corresponding to a white color.

4. The camera module of claim 2, wherein the second pattern includes an RGB tetra pattern.

5. The camera module of claim 4, wherein the first pattern image signal includes a first 2×2 pattern image signal,
wherein the first 2×2 pattern image signal includes a first blue pixel value corresponding to a first blue pixel, a first white pixel value corresponding to a first white pixel, a second blue pixel value corresponding to a second blue pixel, and a second white pixel value corresponding to a second white pixel,
wherein the first blue pixel, the first white pixel, the second blue pixel, and the second white pixel are arranged in a clockwise direction, and
wherein the pixel array includes the first blue pixel, the first white pixel, the second blue pixel, and the second white pixel.

6. The camera module of claim 5, wherein the second pattern image signal includes a second 2×2 pattern image signal, and
wherein the second 2×2 pattern image signal includes four pixel values that correspond to a blue color and generated based on the first blue pixel value and the second blue pixel value.

7. The camera module of claim 6, wherein the first pattern image signal further includes a 4×2 pattern image signal,
wherein the 4×2 pattern image signal includes a first red pixel value corresponding to a first red pixel, a third white pixel value corresponding to a third white pixel, a first green pixel value corresponding to a first green pixel, a fourth white pixel value corresponding to a fourth white pixel, a second green pixel value corresponding to a second green pixel, a fifth white pixel value corresponding to a fifth white pixel, a second red pixel value corresponding to a second red pixel, and a sixth white pixel value corresponding to a sixth white pixel,
wherein the first red pixel, the third white pixel, the first green pixel, the fourth white pixel, the second green pixel, the fifth white pixel, the second red pixel, and the sixth white pixel are arranged in the clockwise direction, and
wherein the pixel array includes the first red pixel, the third white pixel, the first green pixel, the fourth white pixel, the second green pixel, the fifth white pixel, the second red pixel, and the sixth white pixel.

8. The camera module of claim 7, the interface is configured to transmit the third pattern image signal to the external application processor using a mobile industry processor interface.

9. The camera module of claim 7, the interface is configured to transmit the third pattern image signal to the external application processor using a camera serial interface.

10. A camera module comprising:
a pixel array including color filters having a first pattern, the pixel array being configured to sense light incident on the pixel array to generate a first pattern image signal having the first pattern;
a first converter configured to convert the first pattern image signal into a second pattern image signal having a second pattern that is different from the first pattern and includes an RGB color pattern;
a second converter configured to convert the second pattern image signal into a third pattern image signal having a third pattern that is different from the first pattern and the second pattern; and
an interface configured to communicate with an external application processor,
wherein a pixel of the pixel array includes a 4×4 pixel array including 2 red pixels, 4 green pixels, 2 blue pixels, and 8 white pixels, and
wherein the 4 green pixels are sequentially arranged along a diagonal line.

11. The camera module of claim 10, wherein the third pattern includes an RGB Bayer pattern.

12. The camera module of claim 10, wherein the second pattern image signal does not include white pixel value corresponding to a white color.

13. The camera module of claim 11, wherein the second pattern includes an RGB tetra pattern.

14. The camera module of claim 13, wherein the first pattern image signal includes a first 2×2 pattern image signal,
  wherein the first 2×2 pattern image signal includes a first blue pixel value corresponding to a first blue pixel, a first white pixel value corresponding to a first white pixel, a second blue pixel value corresponding to a second blue pixel, and a second white pixel value corresponding to a second white pixel,
  wherein the first blue pixel, the first white pixel, the second blue pixel, and the second white pixel are arranged in a clockwise direction, and
  wherein the pixel array includes the first blue pixel, the first white pixel, the second blue pixel, and the second white pixel.

15. The camera module of claim 14, wherein the second pattern image signal includes a second 2×2 pattern image signal, and
  wherein the second 2×2 pattern image signal includes four pixel values that correspond to a blue color and generated based on the first blue pixel value and the second blue pixel value.

16. The camera module of claim 15, wherein the first pattern image signal further includes a 4×2 pattern image signal,
  wherein the 4×2 pattern image signal includes a first red pixel value corresponding to a first red pixel, a third white pixel value corresponding to a third white pixel, a first green pixel value corresponding to a first green pixel, a fourth white pixel value corresponding to a fourth white pixel, a second green pixel value corresponding to a second green pixel, a fifth white pixel value corresponding to a fifth white pixel, a second red pixel value corresponding to a second red pixel, and a sixth white pixel value corresponding to a sixth white pixel,
  wherein the first red pixel, the third white pixel, the first green pixel, the fourth white pixel, the second green pixel, the fifth white pixel, the second red pixel, and the sixth white pixel are arranged in the clockwise direction, and
  wherein the pixel array includes the first red pixel, the third white pixel, the first green pixel, the fourth white pixel, the second green pixel, the fifth white pixel, the second red pixel, and the sixth white pixel.

17. The camera module of claim 16, the interface is configured to transmit the third pattern image signal to the external application processor using a mobile industry processor interface.

18. The camera module of claim 16, the interface is configured to transmit the third pattern image signal to the external application processor using a camera serial interface.

19. The camera module of claim 16, wherein the first converter, the second converter, and the interface are implemented on a single chip.

* * * * *